United States Patent [19]

Tenengolts

[11] Patent Number: 4,782,490

[45] Date of Patent: Nov. 1, 1988

[54] METHOD AND A SYSTEM FOR MULTIPLE ERROR DETECTION AND CORRECTION

[75] Inventor: Grigory Tenengolts, San Jose, Calif.

[73] Assignee: Cythera Corporation, San Jose, Calif.

[21] Appl. No.: 25,978

[22] Filed: Mar. 16, 1987

[51] Int. Cl.$^4$ ............................................... C06F 11/10
[52] U.S. Cl. ......................................... 371/40; 371/37
[58] Field of Search ...................... 371/37, 38, 39, 40, 371/3

[56] References Cited

U.S. PATENT DOCUMENTS

| | | | |
|---|---|---|---|
| 4,142,174 | 2/1979 | Chen | 371/37 |
| 4,360,916 | 11/1982 | Kustedjo | 371/37 |
| 4,413,339 | 11/1983 | Riggle | 371/38 |
| 4,597,083 | 6/1986 | Stenerson | 371/38 |
| 4,630,271 | 12/1986 | Yamada | 371/37 |
| 4,649,541 | 3/1987 | Lahmeyer | 371/40 X |

*Primary Examiner*—Jerry Smith
*Assistant Examiner*—Robert W. Beausoliel
*Attorney, Agent, or Firm*—Thomas E. Schatzel

[57] ABSTRACT

Disclosed is a method and a system for error detection and correction in which codewords are made up of data and two groups of check symbols. The first group of check symbols is generated by a correction verification code, which verifies error correction; and, the second group of check symbols is generated by an interleaved Reed-Solomon code with symbols from the Galois field GF($2^8$), which serves for error correction.

The correction verification code is cyclic with a generator polynomial $$g_v(x) = x^2 + 1$$

over the field GF($2^8$).

The Reed-Solomon code has a form $$g_0(x) = x^4 + \alpha^{54}x^3 + \alpha^9 x^2 + \alpha^{54}x + 1,$$

where $\alpha$ is a primitive element of the field GF($2^8$), generated by a polynomial $$p(x) = x^8 + x^6 + x^5 + ^4 + 1.$$

The error correction system decoder uses the first root $x_1$ of an error location polynomial $$\sigma(x) = x^2 + \sigma_1 x + \sigma_2$$

to calculate the second root $x_2$ of the polynominal.

The detection system, which employs a portion of the error correction system circuitry, uses a generalized Hamming cyclic code with a generator polynomial $$g_d(x) = x^2 + \alpha^9 x + 1$$

where $\alpha$ is a root of a primitive polynomial $$p(x) = x^8 + x^6 + x^5 + x^4 + 1$$

over the field GF(2).

20 Claims, 8 Drawing Sheets

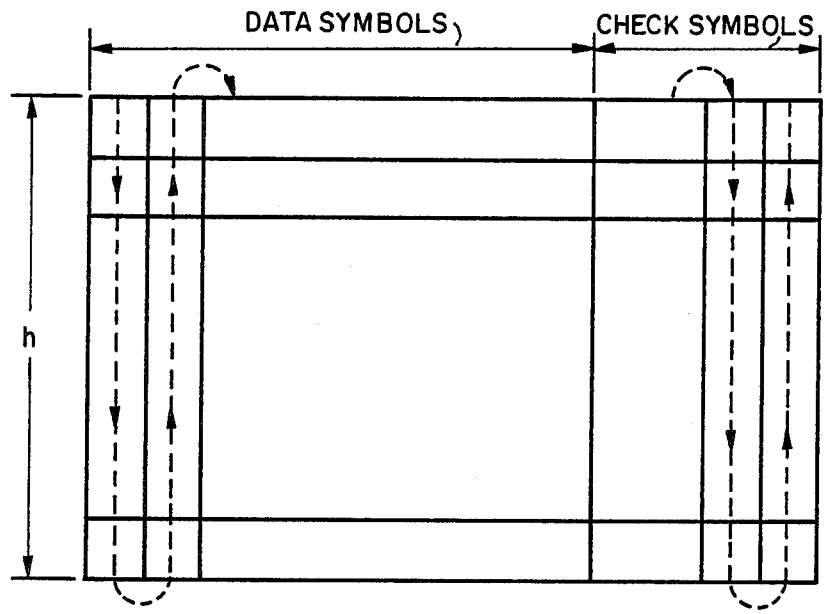
FIG_1
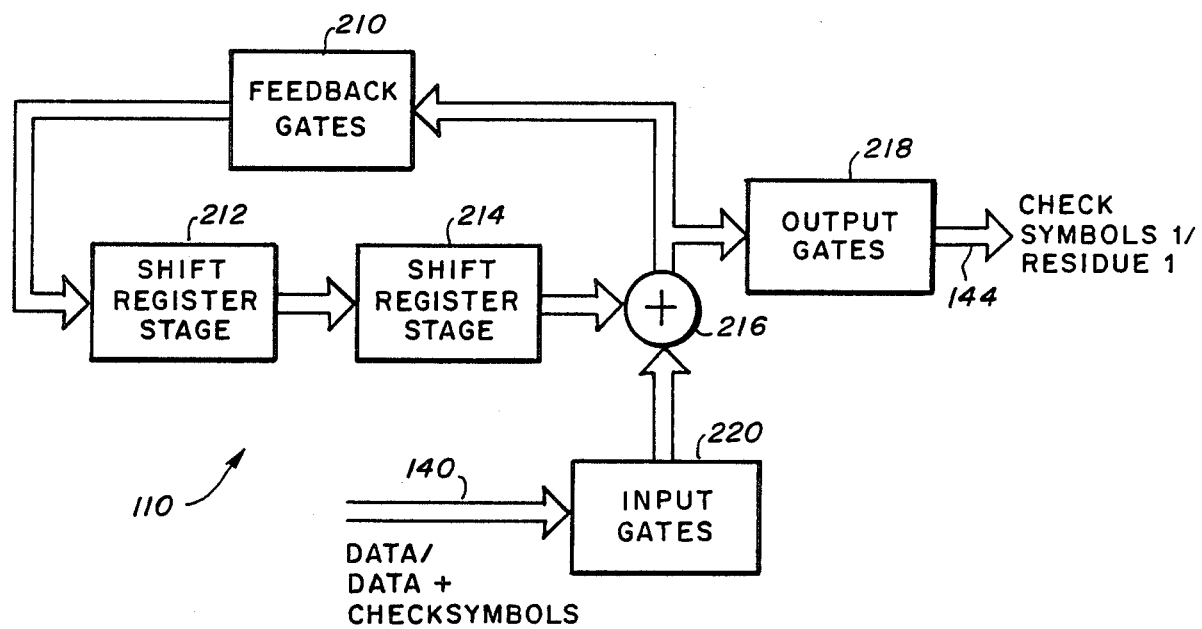
FIG_3

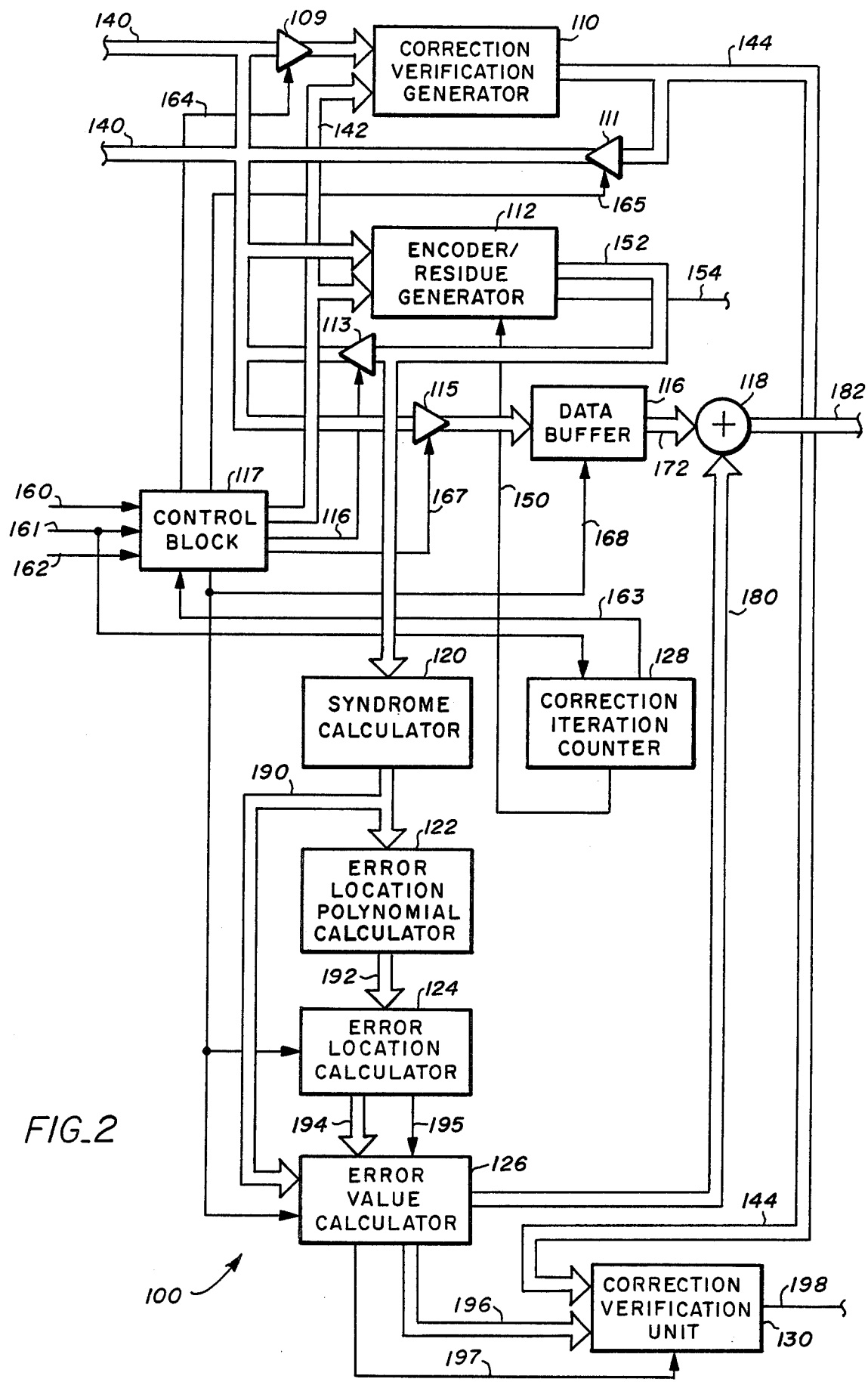
FIG_2

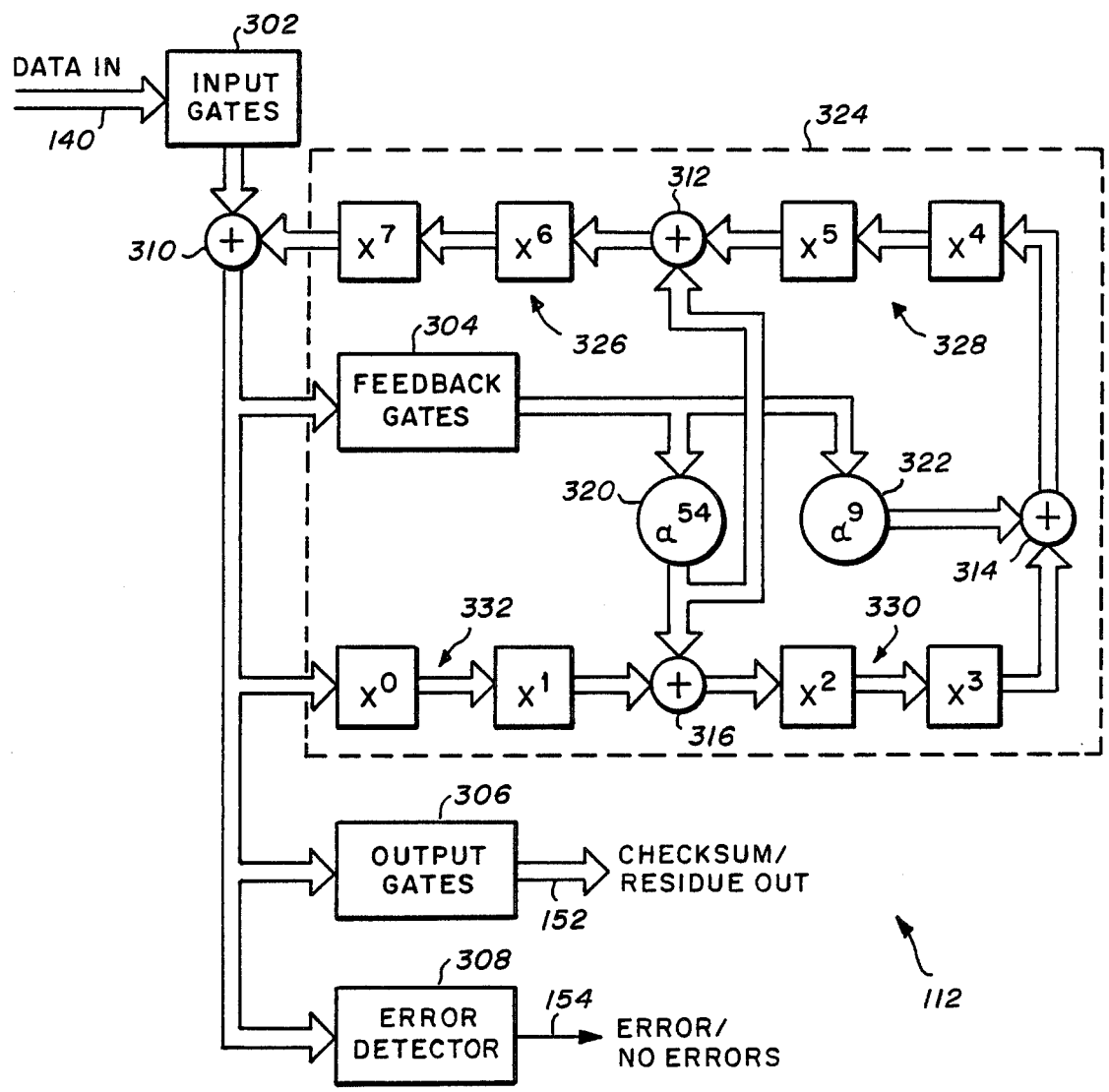
FIG_4

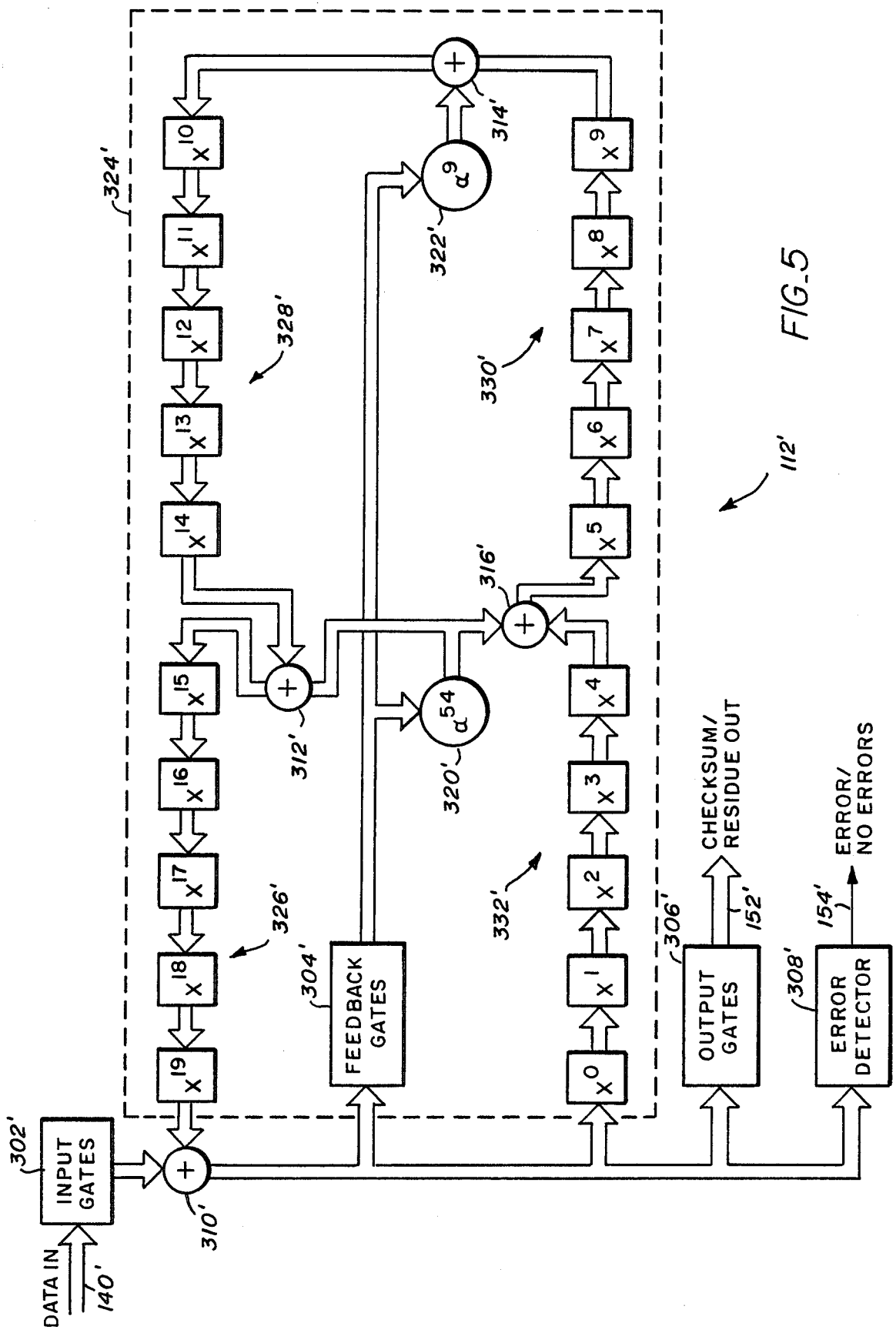
FIG._5

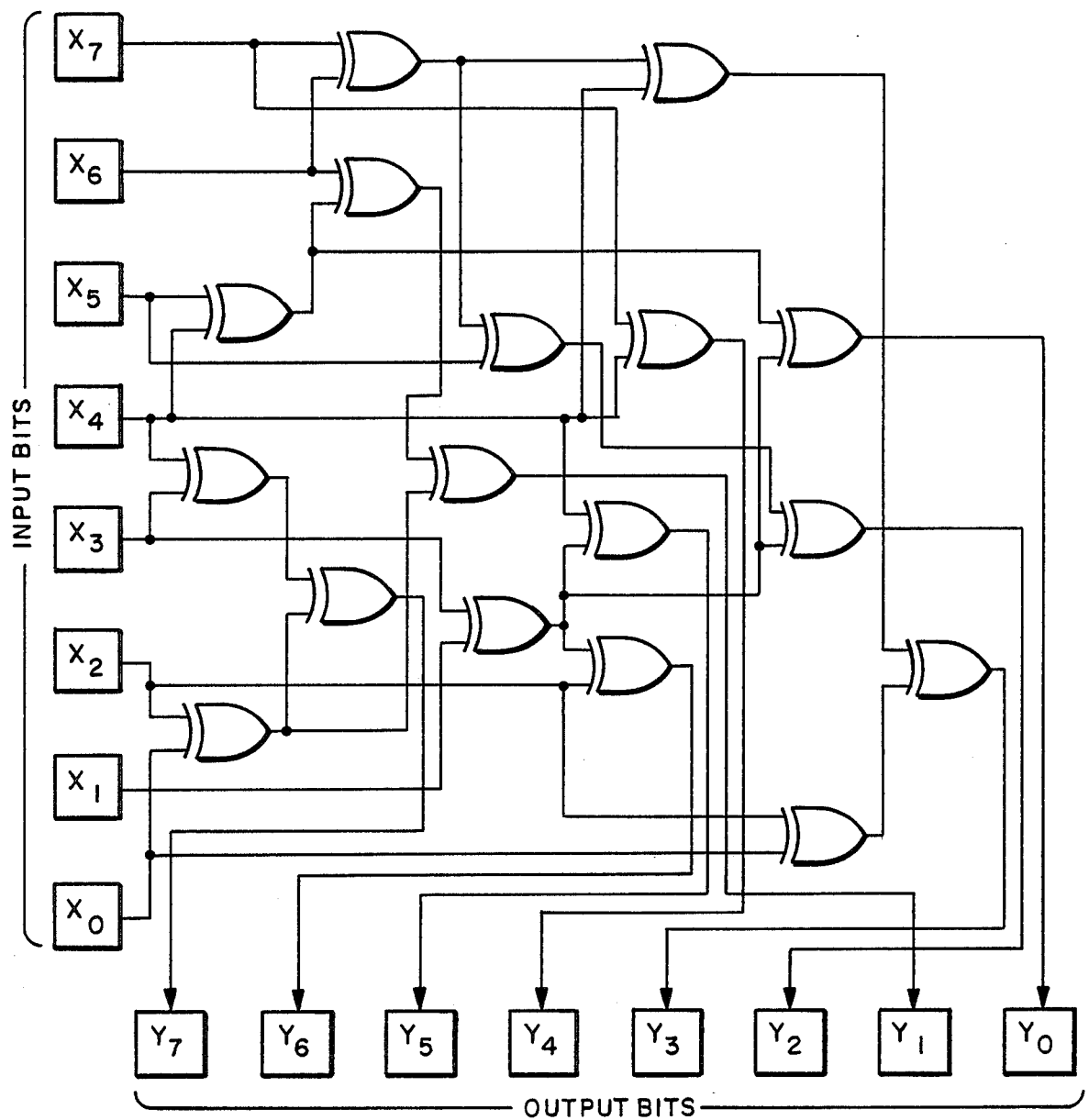
FIG_6

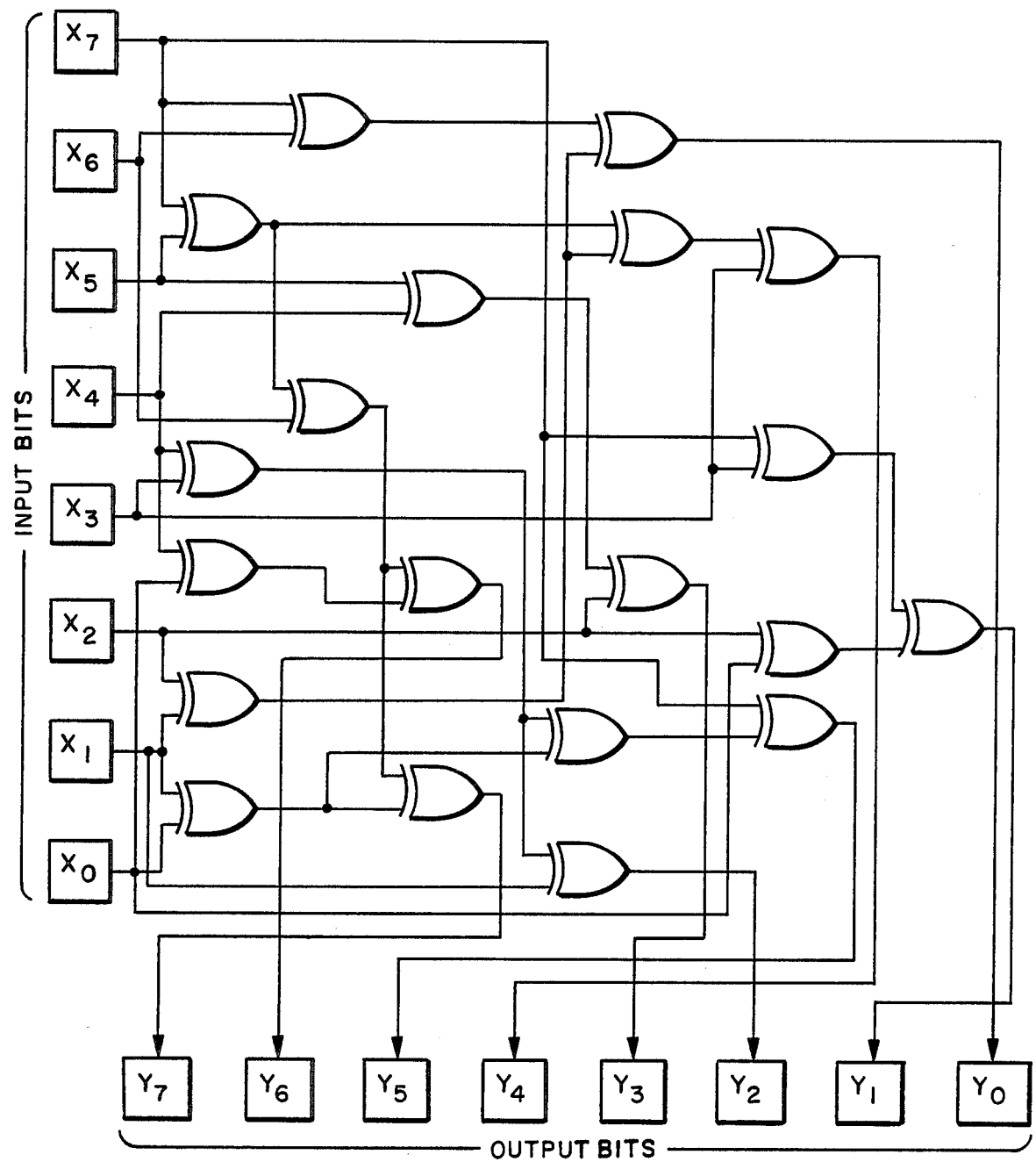
FIG_7

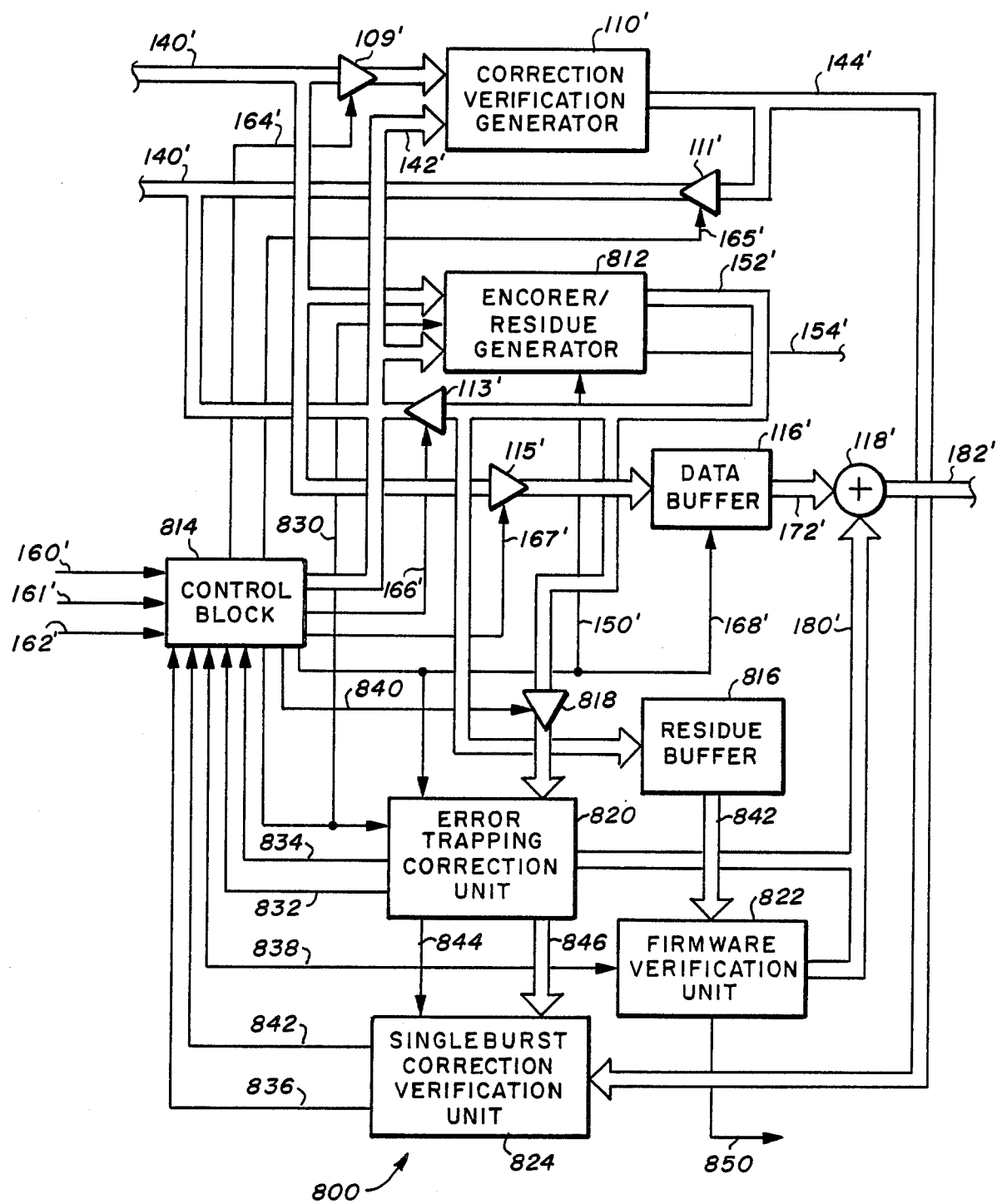
FIG_8

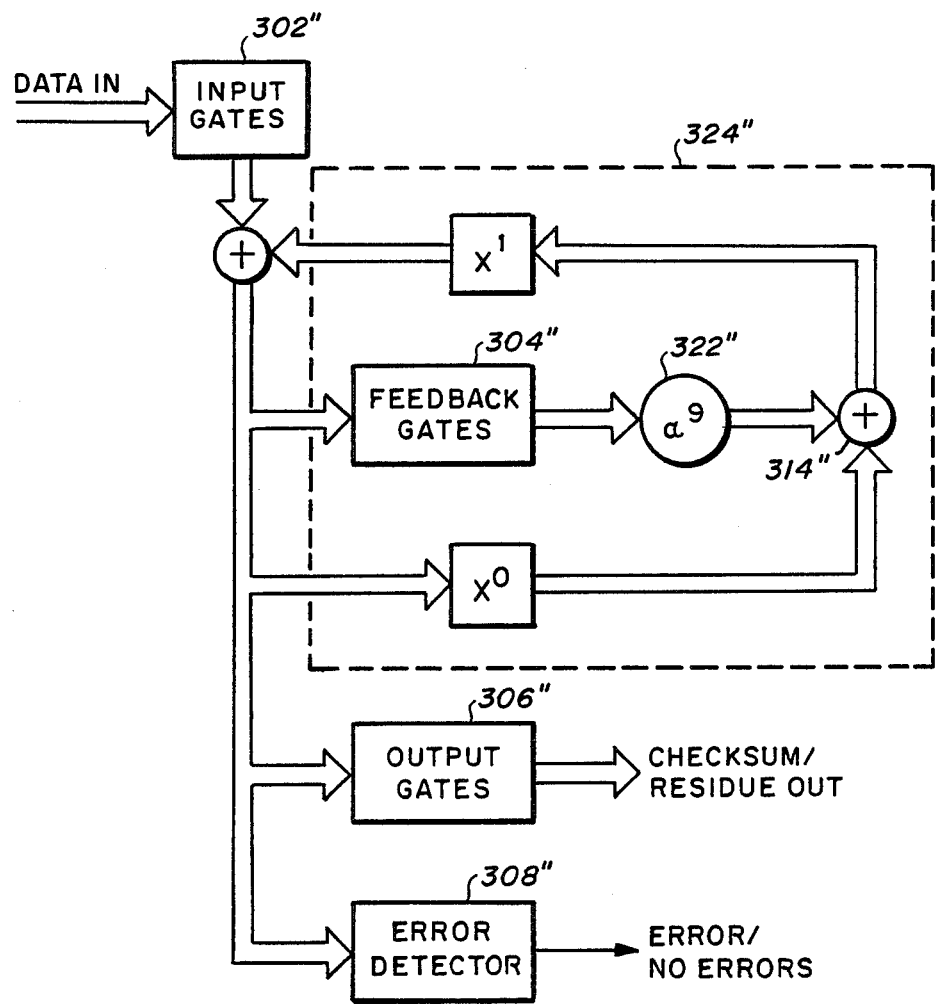
FIG_9

METHOD AND A SYSTEM FOR MULTIPLE ERROR DETECTION AND CORRECTION

TECHNICAL FIELD

The present invention relates to disk data storage systems generally and more specifically to a method and a system for error detection and correction employing an interleaved Reed-Solomon code.

BACKGROUND ART

Reed-Solomon codes are nonbinary codes that can correct multiple, clustered errors, such as occur in disk data storage systems. In order to use such a code to correct errors in binary data, the data is assembled in groups of m bits. These groups represent symbols from the Galois field $GF(2^m)$. A Reed-Solomon code that corrects t errors will correct any errors in t groups of length m.

In a Reed-Solomon code, every codeword is represented by a code polynomial $$C(x) = c_{n-1}x^{n-1} + c_{n-2}x^{n+2} + \ldots + c_0,$$

where $c_0, c_1, \ldots,$ and $c_{n-k-1}$
are check symbols and
$c_{n-k}, c_{n-k+1}, \ldots,$ and $c_{n-1}$
are data symbols. The code is characterized by the generator polynomial $g(x)$. The degree of a polynomial $g(x)$ is equal to the code redundancy $n-k$. The period T of a polynomial $g(x)$ (the minimum T, such that $g(x)$ divides $x^T - 1$) is equal to the code length. Every code polynomial can be expressed as a multiple of $g(x)$.

The check symbols
$c_0, c_1, c_2, \ldots,$ and $c_{n-k-1}$
are generated from data symbols
$c_{n-1}, c_{n-2}, \ldots,$ and $c_{n-k}$
by dividing the "data" polynomial $$x^{n-k}(c_{n-1}x^{k-1} + c_{n-2}x^{k-2} + \ldots + c_{n-k+1}x + c_{n-k})$$

by $g(x)$. The "check" polynomial $$c_{n-k-1}x^{n-k-1} + c_{n-k-2}x^{n-k-2} + \ldots + c_1x + c_0$$

is the "remainder" of this division.

In decoding, the received codeword $r(x)$ is divided by $g(x)$. If the remainder is equal to 0, it it assumed that there are no errors. Otherwise, it is concluded that an error has occurred and an error correction routine is invoked.

The choice of a generator polynomial $g(x)$ determines the error correction capability and the complexity of the encoding and decoding circuitry.

By reducing the number of different nonzero coefficients of the generator polynomial $g(x)$, the number of electrical circuit components for encoding and decoding (error detection) can be reduced.

The error correction routine calculates syndromes $S_i$ from $S(x)$, the remainder of the division of the received codeword $r(x)$ by the generator polynomial $g(x)$ $$S_i = S(\alpha^i),$$

where $$S(x) = r(x) \mod g(x) \text{ and } \alpha^i$$

are roots of the polynomial $g(x)$, $\alpha$ is a primitive element of the Galois field $GF(2^m)$.

Error locations and values are calculated from error location and error evaluator polynomials, which are computed from the syndromes. The general algorithm to find an error location polynomial is the Berklekamp-Massey algorithm described in Chapter 9 of *Error Correcting Codes* by Peterson and Weldon, MIT Press, second edition (1972). Once the error location polynomial is computed, the error location is calculated using Chien's search algorithm. Both procedures (Massey-Berklekamp's and Chien's) require a significant number of calculations.

These procedures are a part of the multiple error correction system described in the U.S. Pat. No. 4,413,339, which issued to C. Riggle et al. The C. Riggle et al system implements a Reed-Solomon code with 10-bit symbols. The redundancy of the code is 17 symbols, i.e. 170 bits. The length of the code is equal to $(2^{10} - 1)$ symbols. The code can correct errors in up to eight symbols. The decoder of the C. Riggle et al system calculates $S(x)$ using the same circuitry used by the encoder. The check portion $d(x)$ of the received codeword $r(x)$ is stored in a buffer. The data portion of $r(x)$ is encoded using an encoder which produces a checksum $d_1(x)$. The symbols of $d_1(x)$ and $d(x)$ are XOR'ed to produce $S(x)$. Note, that the C. Riggle et al system needs a substantial amount of memory to store 170 check bits. With 170 check bits, the C. Riggle et al system corrects single burst errors up to 71 bits and double bursts errors up to 31 bits. Additionally, the C. Riggle et al system needs eight combinatorial circuits for multiplication by Galois field elements and 13 half adders.

The C. Riggle et al system provides a means for rapidly correcting a single symbol error using log and antilog tables which represent elements of Galois field $GF(2^{10})$. However, the two tables need $2*(2^{10} - 1)*10$ bits, i.e. 2558 bytes of ROM.

The C. Riggle et al system is not flexible. Using it, one can encode every block of data up to $(10*(2^{10}-1)-170)$ bits in length. Independent of block length, the system needs 170 bits of check bits. In many practical situations it is desirable to have a system which can change redundancy dependent on different block size, i.e. use less redundancy for a smaller block size. Moreover, it is desirable that this reconfiguration, from one block size to another, be implemented with a minimum number of electrical components.

The U.S. Pat. No. 4,142,174, which issued to C. Chen et al describes a high speed decoding scheme for Reed-Solomon code with 8-bit symbols. The C. Chen et al code corrects errors in three symbols. The C. Chen et al scheme does not use an iterative Berlekamp-Massey algorithm to compute error location polynomial. Instead, it provides a method based on the solution of a system of linear equations to find the coefficients of an error location polynomial. Note that in the case of three symbol errors, solving the system of linear equations requires a significant number of computations.

The generator polynomial $g(x)$ of the C. Chen et al system has a form $$g(x) = (x+1)(x+\alpha)(x+\alpha^2)(x+\alpha^3)(x+\alpha^4)(x+\alpha^5),$$

where $\alpha$ is a primitive element of $GF(2^8)$. This polynomial has six coefficients not equal to zero or one. Therefore, the encoder of this polynomial requires six combinatorial circuits to implement multiplication of Galois field elements.

In the U.S. Pat. No. 4,360,916, which issued to S. Kustedjo et al. and the U.S. Pat. No. 4,498,175, which issued to M. Nagumo et al., a loop search procedure is disclosed to find both roots $x_1$ and $x_2$ of an equation $$\sigma(X)=0,$$

where $\sigma(x)$ is an error location polynomial. Since the loop search procedure is used twice, once for each root, the procedure is quite time consuming.

In disk data storage systems, data is commonly protected by an error correcting code, while the associated header is commonly protected by an error detecting code. A typical error detecting code is the CRC-CCITT code (widely used in data communication) which has a generator polynomial $x^{16}+x^{12}+x^5+1$. The CRC-CCITT code detects all single bursts errors of sixteen bits or less and double bursts errors of four bits or less. It is bit serial.

For systems with high data transfer rate, bit serial data transfer might be a drawback.

For additional background information, the reader is referred to *Error Correcting Codes* by Peterson and Weldon, MIT Press, Cambridge, Mass., second edition (1972); *Error Control Coding; Fundamental And Application* by G. Lin and D. J. Costello, Prentice-Hall, Inc., Englewood Cliffs, N.J., 1983 edition; "Interface Between Data Terminal Equipment (DTE) And Data Circuit-Terminating Equipment (DCE) For Terminal Operations In Packet Mode On Public Networks", CCITT Recommendation X.25, With Plenary Assembly, Doc. 7, Geneva, Switzerland, 1980; and "Parallel CRC Lets Many Lines Use One Circuit", by A. K. Pandeya, Computer Design, September 1975, vol. 14, No. 9, p. 87–91.

DISCLOSURE OF THE INVENTION

Accordingly, a broad object of the present invention is to provide a fast and economical system for correcting data which has been corrupted during data transmission or storage.

Another object of the present invention is to provide an adaptive system which can be reconfigured for a different block size, using less redundancy for smaller block sizes.

Another object of the present invention is to provide a simple electrical circuit that implements an encoding scheme which has a high error correcting capability.

Another object of the present invention is to provide a simple circuit to check the result of a correction.

Another object of the present invention is to provide a method for rapidly solving an error location equation.

A further object of the present invention is to provide an error correcting system that can be reconfigured into a fast and economical error detecting system.

These and other objects of the present invention are realized by a method and a system for error detection and correction in which codewords are made up of data and two groups of check symbols. The first group of check symbols is generated by a correction verification code, which verifies error correction; and, the second group of check symbols is generated by an interleaved Reed-Solomon code with symbols from the Galois field $GF(2^8)$, which serves for error correction.

The correction verification code is cyclic with a generator polynomial $$g_v(x)=x^2+1$$

over the field $GF(2^8)$.

The Reed-Solomon code has a form $$g_0(x)=x^4+\alpha^{54}x^3+\alpha^9 x^2+\alpha^{54}x+1,$$

where $\alpha$ is a primitive element of the field $GF(2^8)$, generated by a polynomial $$p(x)=x^8+x^6+x^5+x^4+1.$$

The error correction system decoder uses the first root $x_1$ of an error location polynomial $$\sigma(x)=x^2+\sigma_1 x+\sigma_2$$

to calculate the second root $x_2$ of the polynomial.

The detection system, which employs a portion of the error correction system circuitry, uses a generalized Hamming cyclic code with a generator polynomial $$g_d(x)=x^2+\alpha^9 x+1,$$

where $\alpha$ is a root of a primitive polynomial $$p(x)=x^8+x^6+x^5+x^4+1$$

over the field $GF(2)$.

These and other objects of the present invention will no doubt become apparent to those skilled in the art after having read the detailed description of the presently preferred method and system of the present invention which are illustrated in the figures of the drawing.

BRIEF DESCRIPTION OF THE FIGURES IN THE DRAWINGS

FIG. 1 is a diagram depicting a structure of the interleaved code which is used in this invention;

FIG. 2 is a block diagram of the presently preferred embodiment in accordance with the present invention of an error detection and correction system.

FIG. 3 is a block diagram of the correction verification generator included in the system shown in FIG. 2;

FIG. 4 is a block diagram of the encoder/residue generator for block sizes up to 510 bytes included in the system shown in FIG. 2;

FIG. 5 is a block diagram of the encoder/residue generator for the block sizes from 511 to 1275 bytes included in the system shown in FIG. 2;

FIG. 6 is a block diagram of one of the multiplier circuits used in the encoder/residue generators shown in FIGS. 4 and 5;

FIG. 7 is a block diagram of the other one of the multiplier circuits used in the encoder/residue generators shown in FIGS. 4 and 5;

FIG. 8 is a block diagram of of an error detection and correction system which utilizes an error-trapping technique for single burst correction in accordance with the present invention; and FIG. 9 is a block diagram of an error detection system derived from the encoder/residue generator shown in FIGS. 4 and 5.

BEST MODE FOR CARRYING OUT THE INVENTION

The present invention uses an interleaved Reed-Solomon code (see the previously mentioned Peterson and Weldon reference). Interleaving is implemented by arranging sequences of the basic codewords into h rows of a rectangular array and then transmitting the code column by column, as shown in FIG. 1. The parameter h is called the degree of interleaving. The polynomial of an interleaved code g(x) is described by the polynomial of the basic code $g_0(x)$ and the degree of interleaving h as $$g(x)=g_0(x^h).$$

The basic Reed-Solomon code for the error correcting system of the present invention has a generator polynomial of the form $$g_0(x) = \prod_{j=v}^{v+3} (x + \alpha^j) =$$

$$(x + \alpha^v)(x + \alpha^{v+1})(x + \alpha^{v+2})(x + \alpha^{v+3}),$$

where $\alpha$ is a primitive element of the Galois field $GF(2^m)$ and $$v = 2^{m-1} - 2, m \geq 2.$$

Symbols of this code are m bits wide. This code can correct errors in two symbols.

Note that in order to correct errors in t symbols a generator polynomial of a code should have 2t consecutive roots $$\alpha^v, \alpha^{v+1}, \ldots, \alpha^{v+2t-1}.$$

By choosing v equal to $2^{m-1}-2$, $g_0(x)$ is made reversible, halving the number of nonzero coefficients. The above polynomial $$g_0(x)=(x+\alpha^v)(x+\alpha^{v+1})(x+\alpha^{v+2})(x+\alpha^{v+3})$$

can be rewritten in the form $$g_0(x)=x^4+\alpha^a x^3+\alpha^b x^2+\alpha^a x+1, \qquad (1)$$

where $\alpha$ is a root of a primitive polynomial p(x) of degree m over GF(2). The preferred embodiment employs 8-bit wide symbols, i.e. m=8 and v=126. Also in the preferred embodiment $$p(x)=x^8+x^6+x^5+x^4+1, a=54, b=9.$$

The encoder of this code requires only two combinatorial circuits, one to implement the multiplication by $\alpha^9$ and the other one to implement the multiplication by $\alpha^{54}$. By changing the degree of interleaving it is easy to adapt to different block size.

The maximum length of the interleaved code is equal to $(2^m-1)h$ symbols.

The preferred structure of an error correction and detection system has two different modes for block (record) size. The first (1) is up to 510 bytes in length; and, the second (2) is from 511 bytes to 1275 bytes in length. These two ranges cover practical block sizes. Typical block sizes in storage technology and data communications are 128 and 256 bytes of data (which are covered by the first mode) and 512 and 1024 bytes of data (which are covered by the second mode).

The degree of interleaving for the first and second ranges are equal to two and five, accordingly.

The generator polynomials $g_1(x)$ and $g_2(x)$ for these two modes have the following form $$g_1(x)=g_0(x^2)=x^8+\alpha^{54}x^6+\alpha^9 x^4+\alpha^{54}x^2+1 \qquad (2)$$

and $$g_2(x)=g_0(x^5)=x^{20}+\alpha^{54}x^{15}+\alpha^9 x^{10}+\alpha^{54}x^5+1. \qquad (3)$$

As can be seen from (2) and (3), the degree of the polynomials $g_1(x)$ and $g_2(x)$ are equal to eight and twenty, which means that for the first mode of operation (1) eight check symbols are needed; and, for the second mode of operation (2) twenty symbols are needed. The circuitry for both modes employs the same combinatorial circuits for multiplication by $\alpha^9$ and $\alpha^{54}$. In the first block size mode (1) the code can correct single burst errors up to 25 bits and double burst errors up to 9 bits. Note that in this mode the code can also correct errors in three bytes 75 percent of the time and errors in four bytes 37.5 percent of the time. In the second block size mode (2) the code can correct single burst errors up to 73 bits and double burst errors up to 33 bits. In this mode the code can also correct errors in three bytes 96 percent of the time, errors in four bytes 86.4 percent of the time, errors in five bytes 71.04 percent of the time, errors in six bytes 51.84 percent of the time, errors in seven bytes a significant percent of the time, etc. up to errors in ten bytes.

The degree of interleaving defines the code length and its correction capability. It is possible to use an interleaving degree equal to three for the second mode of operation. In this case the generator polynomial has the form $$g_3(x)=g_0(x^3)=x^{12}+\alpha^{54}x^9+\alpha^9 x^6+\alpha^{54}x^3+1.$$

This code can correct single burst errors up to 41 bits and double burst error up to 17 bits. The redundancy of this code is equal to twelve bytes. The maximum code length is 765 bytes.

The presently preferred embodiment of an error detection and correction system in accordance with the present invention is shown in FIG. 2 of the drawing generally designated by the number 100. System 100 is shown to include a three state deriver, which is designated 109; a correction verification generator, designated 110; another three state driver 111; an encoder/residue generator 112; another three state driver 113; a control block 114; still another three state driver 115; a data buffer 116; a half adder 118; a syndrome calculator 120; an error location polynomial calculator 122; an error location calculator 124; an error value calculator 126; a correction iteration counter 128; and a correction verification unit 130.

Correction verification generator 110 has a set of inputs selectively coupled to a bus 140 by three state driver 109 to receive externally generated signals representing bytes of data (for encoding in an encoding mode) and representing codewords (data followed by (first) check symbols (1)) (for correction verification in a decoding mode). Additionally, correction verification generator 110 has a set of inputs connected to a bus 142 to receive signals for control and initialization; and a set of outputs connected to a bus 144 upon which the generator develops signals representing bytes of (the first) check symbols (1), following the data, in the encoding mode and (a first) residue (1), in the decoding mode. Bus 144 is selectively coupled to bus 140 by three state driver 111.

Encoder/residue generator 112 has a set of inputs connected to bus 142 to receive the control/initialization signals; a set of inputs connected to bus 140 to receive the data signals followed by the check symbol (1) signals, in the encoding mode, and the codeword signals (the data followed by the check symbols (1) followed by (second) check symbols (2)), in the decoding mode; an input connected to a line 150 to receive an iteration controlling signal; a set of outputs connected to a bus 152 upon which the generator develops signals representing bytes of (the second) check symbols (2) in the encoding mode, and representing bytes of (a second) residue (2), in the decoding mode; and an output connected to a line 154 upon which generator 112 develops a signal which indicates the detection of an error. Bus 152 is selectively coupled to bus 140 by three state driver 113.

Control block 114 has a pair of inputs each connected to a respective one of a pair of lines, respectively designated 160 and 161, to receive externally generated signals, one controlling the mode of operation (encoding/decoding) and the other controlling the record size (up to 510 bytes or between 511 and 1275 bytes); an input connected to a line 162 to receive an externally generated signal initializing the shift registers of correction verification generator 110 and encoder/residue generator 112 (as will become apparent shortly); and an input connected to a line 163 upon which correction verification iteration counter 128 develops a signal indicating the termination of a correction procedure. In addition, block 114 has a set of outputs connected to bus 142 upon which the block develops the control/initialization signals, four outputs each connected to a respective one of four lines, respectively designated 164, 165, 166, and 167, upon which the block develops signals for enabling three state drivers 109, 111, 113, and 115, respectively, and a line 168 upon which the block develops a signal for terminating a correction procedure. Block 114 develops a signal on line 164 which is active to enable three state buffer 109 to couple to correction verification generator 110 data represented by signals developed on bus 140 during encoding. During encoding, the signal developed on line 164 is inactive while check symbols ((1) and (2)) are being shifted out of correction verification generator 110 and encoder/residue generator 112, respectively. During decoding, the signal developed on line 164 is active only while data and check symbols (1) are being received by correction verification generator 110. A signal is developed by block 114 on line 165 which is active only during encoding and only active then while check symbols (1) are being shifted out of correction verification generator 110. Similarly, a signal is developed by block 114 on line 166 which is active only during encoding and only active then while check symbols (2) are being shifted out of encoder/residue generator 112. Finally, block 114 develops a signal on line 167 which is active only during decoding and only active then while data is being shifted into data buffer 116.

Data buffer 116 has a set of inputs selectively coupled to bus 140 by three state driver 115 to receive the data signals; an input connected to line 168 to receive the signal indicating the termination of the correction procedure; and a set of outputs connected to a bus 172 upon which the buffer develops signals representing the stored data.

Half adder 118 has a set of inputs connected to bus 172 to receive the stored data signals; a set of inputs connected to a bus 180 to receive signals representing bytes of data for correcting the stored data; and a set of outputs connected to a bus 182 upon which the adder develops signals representing corrected bytes of data for driving external circuitry.

Syndrome calculator 120 is shown to have inputs connected to bus 152 to receive the residue signals and outputs connected to a bus 190.

Error location polynomial calculator 122 is shown to have inputs connected to bus 190 and outputs connected to a bus 192.

Error location calculator 124 is shown to have inputs connected to bus 192, an input connected to line 168, outputs connected to a bus 194, and an output connected to a line 195.

Error value calculator 126 is shown to have inputs connected to buses 190 and 194 and to lines 168 and 195 and outputs connected to bus 180, to a bus 196, and to a line 197. Error location calculator 124 develops on line 195 a signal which when in an inactive state forces error value calculator 126 to develop on bus 180 signals (all zero) which pass through half adder 118 (unchanged) a good byte of data. When active, the signal on line 195 forces onto bus 180 signals which effect correction of the current (bad) byte of data. At the end of each iteration step in the decoding procedure, error value calculator 126 develops on bus 196 signals representing the value of erroneous bytes of data and develops on line 197 a signal which indicates whether each byte is odd or even.

Correction iteration counter 128 is shown to have an input connected to line 161, an output connected to line 150 upon which the counter develops the iteration controlling signal and an output connected to line 163 upon which the counter develops the signal indicating the termination of the correction procedure.

Correction verification unit 130 is shown to have inputs connected to buses 144,196 and to a line 197 and an output connected to a line 198 upon which the unit develops a signal for indicating to external circuitry an uncorrectable error.

In the presently preferred embodiment, the various components of system 100 are all implemented in hardware. In another embodiment, correction verification generator 110, encoder/residue generator 112, control block 114, data buffer 116, and half adder 118 are implemented in hardware; while, syndrome calculator 120, error location polynomial calculator 122, error location calculator 124, error value calculator 126, correction iteration counter 128, and a correction verification unit 130 are implemented in firmware.

Correction verification generator 110 is shown in FIG. 3 of the drawing to have a number of feedback gates, collectively designated 210; a pair of eight bit wide, serially connected, shift register stages, respectively designated 212 and 214; a half adder 216; a number of output gates, collectively designated 218; and a number of input gates, collectively designated 220. The feedback gates, which are collectively designated 210, are configured to selectively couple the signals developed at the set of outputs of half adder 216 to the set of inputs of the first shift register stage 212. The set of outputs of the second shift register stage 214 are connected to the first set of inputs of half adder 216 to couple the signals developed by the stages to the adder. The output gates, which are collectively designated 218, are configured to selectively couple the signals developed at the set of outputs of half adder 216 each to the corresponding line of bus 144. And, the input gates, collectively designated 220, are configured to selectively couple the signals developed on the various lines of bus 140 each to the corresponding input of the other (second) set of half adder 216 inputs. Half adder 216 consists of eight XOR gates.

Operationally, prior to encoding, shift register stages 212 and 214 are preset to all ones; and, the feedback gates, which are collectively designated 210, are enabled. The feedback gates (210) are disabled when the check symbols (in the encoding mode) or the residue (in the decoding mode) is shifted out through the output gates, which are collectively designated 218.

Shown in FIGS. 4 and 5 of the drawing are two configurations of encoder/residue generator 112. FIG. 4 shows the configuration for the first block size mode (1) (up to 510 bytes). FIG. 5 shows the configuration for the second block size mode (2) (between 511 and 1275 bytes). Encoder/residue generator 112 has a number of input gates, collectively designated 302; a number of feedback gates, collectively designated 304; a number of output gates, collectively designated 306; an error detector 308; four half adders, respectively designated 310, 312, 314, and 316; two combinatorial circuits, respectively designated 320 and 322; and a number of shift register stages, which are collectively referred to by the designation 324 and which are divided into four groups of serially connected stages, that are respectively designated 326, 328, 330, and 332.

The input gates, which are collectively designated 302, are configured to selectively couple the signals developed on the various lines of bus 140 each to the corresponding input of the first set of half adder 310 inputs. Signals for driving the other (second) set of inputs of half adder 310 are developed by the group of shift register stages which are designated 326 and which are connected between the set of outputs of half adder 312 and the inputs of half adder 310. The signals for driving the first set of inputs of half adder 312 are developed by the group of shift register stages which are designated 328 and which are connected between the set of outputs of half adder 314 and the inputs of half adder 312; and, the signals for driving the other set of inputs of half adder 312 are developed by the set of outputs of combinatorial circuit 320.

The feedback gates, which are collectively designated 304, are configured to selectively couple the signals developed at the set of outputs of half adder 310 both to the set of inputs of combinatorial circuit 320 and to the set of inputs of combinatorial circuit 322. The signals developed at the set of outputs of combinatorial circuit 322 drive the first set of inputs of half adder 314; and, the signals for driving the other set of inputs of half adder 314 are developed by the group of shift register stages which are designated 330 and which are connected between the set of outputs of half adder 316 and the inputs of half adder 314. The signals developed at the set of outputs of combinatorial circuit 320 drive the first set of inputs of half adder 316; and, the signals for driving the other set of inputs of half adder 316 are developed by the group of shift register stages which are designated 332 and which are connected between the outputs of half adder 310 and the inputs of half adder 316.

The output gates, which are collectively designated 306, are configured to selectively couple the signals developed at the set of outputs of half adder 310 each to the corresponding line of bus 152. Also driven by the signals developed at the set of outputs of half adder 310, error detector 308 develops the signal on line 154. Each of the half adders (310, 312, 314, and 316) have eight XOR gates. Combinatorial circuit 320 implements multiplication by $\alpha^{54}$; and, combinatorial circuit 322 implements multiplication by $\alpha^9$, both in the Galois field GF($2^8$), generated by the polynomial $x^8+x^6+x^5+x^4+1$. The shift register stages (324) are each eight bit wide. The buses each have eight lines. The encoder/residue generators (112 and 112') of FIGS. 4 and 5 differ in the number of shift register stages in a group, generator 112 having two stages per group and generator 112' having five stages per group.

The process of encoding/decoding includes setting the stages of shift register 324 to all ones and serially shifting bytes of data/check symbols from bus 140, through the input gates, which are designated 302, and into the stages of the shift register, while the feedback gates, that are designated 304, are enabled. After all of the bytes of a block of data and check symbols (1) (in case of encoding) or a codeword (data followed by check symbols (1) followed by check symbols (2)) (in case of decoding) have been shifted into the stages of shift register 324, the check symbols (2) (in case of encoding) or the residue (2) (in case of decoding) is located in the stages of shift register 324 (in stages $x^0$, $x^1$, $x^2$, ... ). Next, the process includes the step of shifting the check symbols (2)/residue (2) through the stages of shift register 324, through the output gates, which are designated 306, and on to bus 152, while the feedback gates, that are designated 304, are disabled. Following the decoding process, error detector 308 develops on line 154, the signal which indicates whether an error was detected.

It is important to note that the same circuitry, the same control logic, and the same data path are used both for data encoding and residue generating (encoder/residue generator 112). Further, it is important to note encoder/residue generator 112 only has four half adders (310, 312, 314, and 316).

Combinatorial circuits 320 and 322 are presented in FIGS. 6 and 7. These circuits implement multiplication of an element
$x = (x_0, x_1, x_2, \ldots, x_7)$
by $\alpha^{54}$ or $\alpha^9$, respectively, where $\alpha$ is a root of a primitive polynomial $p(x) = x^8+x^6+x^5+x^4+1$. The results of this multiplication is an element $$y = (y_0, y_1, y_2, \ldots, y_7).$$

Returning to FIG. 2, In the encoding mode, signals representing bytes of data are externally generated on bus 140 and are shifted byte serially into correction verification generator 110 and encoder/residue generator 112. Responsive thereto, correction verification generator 110 develops on bus 144 signals representing bytes of (the first) check symbols (1), which are shifted byte serially into encoder/residue generator 112 immediately following the data. Responsive to the data and to the check symbols (1) as "data", encoder/residue generator 112 calculates (the second) check symbols (2)

and develops on bus 152 signals representing the (second) check symbols (2) shifted out byte serially.

The second group of check symbols (2) serves to provide a means for error correction. The first group of check symbols (1) consists of two bytes which are simple byte parity checks for odd and even data bytes. They (the first group of check symbols) only serve to provide a means for correction verification. They are calculated from the data symbols using a cyclic code with a generator polynomial $$g_v(x) = x^2 + 1$$

over Galois field $GF(2^8)$.

In the decoding mode, signals representing bytes of codewords (data followed by the (first) check symbols (1) followed by the (second) check symbols (2) are externally generated on bus 140 and are shifted byte serially into correction verification generator 110, encoder/residue generator 112, and data buffer 116. Responsive to the data followed by the (first) check symbols (1), correction verification generator 110 develops on bus 144 the signals representing the (first) residue (1). Responsive to the data followed by the (first) check symbols (1) followed by the (second) check symbols (2), encoder/residue generator 112 develops on bus 152 the signals representing the (second) residue (2) and the signal on line 154 which indicates whether an error was detected.

If the signal developed on line 154 indicates an error in the current block of data, system 100 starts the error correction procedure. The procedure is iterative. Correction iteration counter 128 defines the number of iterations (two—in case of block size up to 510 bytes——and five—in case of block size between 511 and 1275 bytes) controlled by the signal developed on line 150.

Note that in order to simplify encoder/residue generator 112, the same inputs are used for encoding and decoding. As a result, after receiving a block of data, rather than a syndrome polynomial $$S(x) = S_3 x^3 + S_2 x^2 + S_1 x + S_0,$$

a polynomial $$\bar{S}(x) = \bar{S}_3 x^3 + \bar{S}_2 x^2 + \bar{S}_1 x + \bar{S}_0,$$

is developed (where $\bar{S}_0, \bar{S}_1, \bar{S}_2, \bar{S}_3$ are the contents of the appropriate stages of the shift register of encoder/residue generator 112 (shown in FIGS. 4 and 5)). In other words, $\bar{S}_0, \bar{S}_1, \bar{S}_2, \bar{S}_3$ on the ith decoding iteration step (i = 1, 2, ..., h, where h is the degree of code interleaving) are equal to the contents of the $X^{i-1}$, $X^{i-1+h}$, $X^{i-1+2h}$, and $X^{i-1+3h}$ shift register stages, respectively, after data has been shifted into the shift register. The syndromes $S_i = S(\alpha^{v+i})$ where v = 126 and i = 0, 1, 2, 3, are calculated as $$S_i = \bar{S}(\alpha^{v+i}) / \alpha^{4(v+i)}.$$

The calculation is performed by syndrome calculator 120. Then the standard test for detecting a single symbol error is executed. If the condition $$S_1/S_0 = S_2/S_1 = S_3/S_2 \qquad (4)$$

is true, it is concluded that a single symbol error has occurred. The value of the error is defined by $$Y = (S_0/S_1)^{v+1} S_1; \qquad (5)$$

and, the location L of the error is defined by $$S_1/S_0 = \alpha^L. \qquad (6)$$

If (4) does not hold true, system 100 calculates the value $$\Delta = S_1^2 + S_0 S_2$$

If $\Delta = 0$, system 100 concludes that an uncorrectable error has occurred. If $\neq 0$, the system finds the coefficients $\sigma_1$ and $\sigma_2$ of the error locator polynomial $$\sigma(x) = x^2 + \sigma_1 x + \sigma_2. \qquad (7)$$

The coefficients $\sigma_1$ and $\sigma_2$ are defined as $$\sigma_1 = (S_1 S_2 + S_0 S_3)/\Delta \text{ and}$$

$$\sigma_2 = (S_1 S_3 + S_2)/\Delta.$$

After error location polynomial calculator 122 calculates the coefficients of the polynomial (7), error location calculator 124 finds the error locations; and, error value calculator 126 finds the error values. The signal developed by correction iteration counter 128 on line 163 is used to terminate the correction procedure. The error location and error value is used to correct the data coming out of data buffer 116.

If error location calculator 124 and error value calculator 126 find no errors in the data and check symbols, the data is considered correct. Otherwise, correction verification unit 130 is invoked. On the basis of error values and locations, correction verification unit 130 calculates two bytes $\bar{V}_1$ and $\bar{V}_2$. The two bytes are bit by bit sums by modulo two of error values in odd and even data bytes and check symbols bytes (1), respectively, calculated by error location calculator 124 and error value calculator 126. Correction verification unit 130 compares $\bar{V}_1$ and $\bar{V}_2$ with bytes $V_1$ and $V_2$ which are odd and even bytes of the residue calculated by correction verification generator 110. If $$V_1 = \bar{V}_1 \text{ and } V_2 = \bar{V}_2,$$

the data is corrected. Otherwise, an uncorrectable error is indicated by the signal developed on line 198. (Using only two simple parity check bytes for correction verification, the probability of a miscorrection is substantially reduced (by five orders of magnitude)).

It is important to note that system 100 only requires 512 bytes of ROM for log and antilog tables for multiplication and division in Galois field $GF(2^8)$. Using these tables, multiplication and division in Galois field $GF(2^8)$ are reduced to summation and subtraction by modulo 255. Also, note that correction verification generator 110 calculates bytes $\bar{V}_1$ and $\bar{v}_2$ simultaneously with the calculation of error locations and values avoiding any additional delay. Further, error location calculator 124 only uses a loop search procedure to find the first root $x_1$ of the equation $$\sigma(X) = 0.$$

The second root is defined as $$x_2 = \sigma_1 + x_1. \qquad (8)$$

Since the loop search procedure constitutes the most time consuming part of the correction procedure, the delay which would otherwise be necessary for the procedure is avoided. The roots $x_1$ and $x_2$, calculated by error location calculator 124 are used by error value calculator 126 to find the appropriate error values $Y_1$ and $Y_2$ $$Y_1 = (S_0 x_2 + S_1)/(x_1^v(x_1+x_2))$$

and $$Y_2 = (S_0 x_1 + S_1)/(x_2^v(x_1+x_2)).$$

The location of the errors $L_1$ and $L_2$ is derived from the expressions $$X_1 = \alpha^{L_1} \quad (9)$$

and $$x_2 = \alpha^{L_2}. \quad (10)$$

From the location L (or $L_1$ and $L_2$), at each ith step of iteration (i=1, 2, ..., h), error location calculator 124 calculates the erroneous byte location N in the form $$N = R + h*4 + 1 - h*L - i,$$

where R is the data block size and h is the degree of code interleaving.

The choice of v=126 simplifies the evaluation of the expression $$x_i^v = (\alpha^{j_i})^v = \alpha^{j_i v}$$

(where i=1, 2), since the multiplication of $j_i$ by $v = 2^7 - 2$ can be implemented by shifting the 8-bit binary representation of
$j_i = (j_{i7}, j_{i6}, \ldots, j_{i0})$
left seven positions and one position and subtracting the second shift from the first one.

When all errors can be confined to n−k consecutive symbols of the received word, (where n−k is the number of checking symbols) the decoding can be implemented using an error trapping technique (see, for example, Lin G., Costello D. J. Jr. Error Control coding: Fundamental and applications, Prentice-Hall, 1983). Since single burst errors are confined to (n−k)/2 consecutive symbols, such an error trapping technique is employed in the embodiment of the error detection and correction system of the present invention which is shown in FIG. 8 of the drawing generally designated by the number 800. Like system 100, (shown in FIG. 2) system 800 includes a three state driver 109', a correction verification generator 110', three more three state drivers 111', 113', and 115', a data buffer 116', and a half adder 118', each of which is similiar to the corresponding component of system 100. In addition, system 800 includes an encoder/residue generator 812, a control block 814, a residue buffer 816, a three state driver 818, an error trapping correction unit 820, a firmware correction unit 822, and a single burst correction verification unit 824.

Encoder/residue generator 812 differs from generator 112 (shown in FIG. 2) in that generator 812 has an additional input connected to a line 830.

Control block 814 differs from block 114 in that block 814 has three additional inputs, each connected to the respective one of three lines, respectively designated 832, 834, and 836. Also, block 814 has three additional outputs, one connected to a line 838, another connected to line 830, and the third connected to a line 840. Block 814 develops on line 838 a signal for initiating correction by firmware correction unit 822 and develops on line 830 a signal which is active during preshifting and shifting of encoder/residue generator 812.

Residue buffer 816 is shown to have inputs connected to bus 152' to receive the residue signals and outputs connected to a bus 842.

Error trapping correction unit 820 is shown to have an input connected to line 830, another input connected to line 168', and a set of inputs selectively coupled to bus 152' by three state driver 818. In addition, unit 820 has an output connected to line 834, another output connected to line 832, still another output connected to a line 844, a set of outputs connected to bus 180' and another set of outputs connected to a bus 846. Unit 820 has a displacement counter for counting the number of shifts s of the shift register of encoder/residue generator 812.

Firmware correction unit 822 is shown to have an input connected to line 838, a set of inputs connected to bus 842, an output connected to a line 850, and a set of outputs connected to bus 180'. Unit 822 implements in firmware the decoding procedure (including correction verification) described in connection with FIG. 2.

Single burst correction verification unit 824 is shown to have an input connected to line 844, a set of inputs connected to buses 846 and 144', an output connected to line 842, and an output connected to line 836. Unit 824 differs from correction verification unit 130 (shown in FIG. 2) in that unit 824 has an additional output and is connected differently.

Encoding proceeds as with system 100 (shown in FIG. 2).

In the decoding mode, if the signal developed on line 154' indicates an error in the current block of data, the residue represented by the signals developed by encoder/residue generator 812 on bus 152' is saved in residue buffer 816. Error trapping correction unit 820 is then invoked. The shift register of encoder/residue generator 812 is preshifted N byte clock cycles, where $N = h*255 - (R+2+4h)$; R is the record size (in bytes of data) and h is the degree of interleaving. In case of R=256 bytes, h=2 and N=244; in the case of R=512 bytes, h=5 and N=741; and, finally, in the case of R=1024 bytes, h=5 and N=229.

Then shift register of encoder/residue generator 812 is shifted s(s≧0) bytes (clock cycles), until stages $x^0, x^1, x^2, x^3$, in case of the first mode, (R=256 bytes) or $x^0, x^1, x^2, \ldots, x^9$, in case of the second mode, (R=512 or 1024 bytes) contain all zeros. Symbols in stages $x^7, x^6, x^5, x^4$, (in the first mode) or in stages $x^{19}, x^{18}, \ldots, x^{10}$ (in the second mode) correspond to the error pattern in bytes s+1, s+2, s+3, s+4 (in the first mode) or bytes s+1, s+2, ..., s+10 (in the second mode). (Note that the first byte of data is byte 1). The results of the correction is checked by single burst correction verification unit 824. If after R+2+2h shifts, stages $x^0, x^1, x^2, x^3$ (in the first mode) or stages $x^0, x^1, \ldots, x^9$ (in the second mode) don't contain all zeros, error trapping correction unit 820 develops an active level signal on line 834, causing control block 814 to develop an active level signal on line 838 initiating correction by firmware correction unit 822. If stages $x^0, x^1, x^2, x^3$ (in the first mode) or stages $x^0, x^1, \ldots, x^9$ (in the second mode) all contain zeros, error trapping correction unit 820 develops an active level signal on line 832, causing control block 814 to develop an active level signal on line 840 transferring single burst bytes through three state driver 818 into unit 820.

As the single burst bytes are transferred through a bus 846 into single burst correction verification unit 824, error trapping correction unit 820 develops on line 844 a signal the state of which indicates whether each of the bytes are odd or even. Single burst correction verification unit 824 compares bit by bit sums by modulo two of the error values in odd and even data bytes and check symbols (1) with the respective bytes of the residue calculated by correction verification generator 110'. If the results of the comparison indicate that the single burst correction is valid, single burst correction verification unit 824 develops an active level signal on line 842. Responsive thereto, control block 814 develops an active level signal on line 168' initiating the transfer of data from data buffer 116' and starting the process of decrementing the displacement counter of error trapping correction unit 820. While the displacement counter of error trapping correction unit 820 has a non-zero value, signals developed by unit 820 on bus 180' are forced to all zeros, passing good data, unchanged, through half adder 118'. When the displacement counter of error trapping correction unit 820 reaches zero, erroneous bytes are shifted out of error trapping correction unit 820 onto bus 180' effecting correction of the bytes coming out of data buffer 116'.

If the results of the comparison by single burst correction verification unit 824 indicate that the single burst correction is not valid, single burst correction unit 824 develops an active level signal on line 836 causing control block 814 to develop an active level signal on line 838 initiating correction by firmware correction unit 822. If the results of the correction by firmware correction unit 822 are not valid, the unit develops an active level signal on line 850. Otherwise, an active level signal is developed on line 168' initiating transfer of the data from data buffer 116' and XORing appropriate bytes of the data with the bytes forced out of firmware correction unit 822 onto bus 180'.

It is important to note that the clock periods employed in decoding are shorter than clock periods employed in data transfer (for example, ¼ of the data transfer clock periods). This allows a single burst correction to be performed in the record transfer time. System 100 (presented in FIG. 2) is much faster at decoding than system 800 (presented in FIG. 8). However, system 100 has more complicated circuitry than system 800. Even though slower than system 100, system 800 is faster than typical error correction systems in which decoding is implemented completely in firmware. Since single burst errors are the errors most frequently encountered in magnetic storage, the system 800 is attractive for magnetic disk and tape applications. Additionally, both systems (100 and 800) are efficient in data storage and communication applications.

For the protection of a header (in disk storage systems) and data (in data communication systems), an error detection code is employed which is symbols (bytes) serial for a high data transfer rate. A basic polynomial $g_0(x)$ of an interleaved Reed-Solomon code is employed, one which has a minimal number of nonzero coefficients and which can be implemented using the above hardware.

More specifically, the following fact is used.

Statement:

Let a generator polynomial of the code have a form $$g_d(x) = x^2 + ax + 1; \tag{11}$$

and be irreducible over the Galois field $GF(2^m)$. Let the root $\beta$ of the polynomial have a period T (i.e. minimal T, such that $\beta^T = \beta$) expressed as $$T = ((2^m)^2 - 1)/(2^m - 1). \tag{12}$$

Then the code is a generalized Hamming code.

Proof:

Since 2 and $2^m - 1$ are relatively prime, according to the theorem 8.4 (Peterson and Weldon, p. 221), the code is a generalized Hamming code.

A polynomial $$g_0(x) = x^4 + a^a x^3 + a^b x^2 + a^a x + 1$$

of (2) chosen such that the polynomial $$g_d(x) = x^2 + a^c x + 1,$$

where $c = a$ or $b$, is irreducible over the Galois field $GF(2^m)$ and its root has a period expressed by (12).

Then, by using two stages of a shift register for the encoding of (2) and a combinatorial circuit for multiplication by $a^c$, an encoder results for the generalized Hamming code, which corrects single symbol or detects double symbol errors.

In the presently preferred embodiment $m = 8$ and the generator polynomial $$g_d(x) = x^2 + a^9 x + 1 \tag{13}$$

is employed, where $a$ is a root of the primitive polynomial $$p(x) = x^8 + x^6 + x^5 + x^4 + 1 \tag{14}$$

over GF(2).

The polynomial $$g_d(x) = x^2 + a^9 x + 1,$$

where $a$ satisfies the condition (14) is irreducible in the Galois field $GF(2^8)$. The root of the polynomial $\beta$ has a period $$T = 257 = ((2^8)^2 - 1)/(2^8 - 1).$$

Then, according to the above statement, the code with the generator polynomial, satisfying the conditions (13) and (14) is a generalized Hamming code.

This code has the following important property which characterizes its single burst detection capability.

Property:

A code with a generator polynomial that satisfies the conditions (13 and 14) detects all single bursts of 16 bits or less.

Proof:

Errors which couldn't be detected by this code should have a polynomial representation in the form of a multiple of a generator polynomial $$g_d(x) = x^2 + a^9 x + 1.$$

The minimum length single burst, which couldn't be detected, should have a polynomial representation in the form $$u(x) = x^k \alpha^p (x^2 + \alpha^9 x + 1), \quad (15)$$

where $k < n_d$ ($n_d$ is a code length) and $0 \leq p \leq 254$.

Errors associated with a polynomial u(x) of (15) occupy three consecutive bytes.

We will calculate the actual length of the burst that occupies these three consecutive bytes. Every element a of a Galois field $GF(2^8)$ can be represented in the following form $$a = \sum_{i=0}^{7} a_i \alpha^i, \quad (16)$$

where $\alpha$ is a primitive element of $GF(2^8)$.

We will call the width wd(a) of an element a maximum u such that $a_u$ in (16) is not equal to 0, i.e. $wd(a) = u$.

Then, the length $l_u$ of a single burst with a polynomial representation (16) is equal to the sum $$l_u = l_1 + 8 + l_2,$$

where $l_1$ is the length of a portion of the burst located in the first of three consecutive bytes and $l_2$ is the length of a portion of the burst located in the last byte. But $$l_1 = wd(\alpha^p)1 \text{ and}$$

$$l_2 \geq 8 - wd(\alpha^p).$$

Therefore, $$l_u \geq wd(\alpha^p) + 1 + 8 + 8 - wd(\alpha^p) \geq 17.$$

In case of p=0 in (15), we have $l_u = 17$.

We have proved that the minimal length of a single undetected burst is equal to 17. Hence, all single bursts of 16 or less bits are detectable.

From the property it follows that a code with a generator polynomial $$g(x) = x^2 + \alpha^9 x + 1,$$

which satisfies the condition (14) has the same single burst detection capability as the 16 bit CRC—CCITT code typically used for error detection. It can detect double bursts of one bit length, since it detects any error in two bytes.

The results of simple computer evaluation show that this code detects double bursts errors of length three bits or less (one bit less than the CRC—CCITT code). Since, in addition, the code of the present invention detects all errors in two bytes, its detection capability is approximately the same as that of the CRC—CCITT code.

Furthermore, the implementation of this code doesn't need additional circuitry.

An encoder/residue generator for this code is presented in FIG. 9. This encoder/residue generator is similar to the encoders/residue generators of FIGS. 4 and 5. The only difference is that shift register 324" of FIG. 9 has only two stages: $x^0$ and $x^1$.

The presented detection system may be successfully used in data communication systems. Typically, in these systems, in order to use the same circuit by many transmission lines, bit serial CRC is implemented with parallel circuits. (See, for example, "Parallel CRC Lets Many Lines Use One Circuit", by A. K. Pandeya, Computer Design, September 1975, vol. 14, No. 9, p. 87–91.)

The presented system, which employs a nonbinary Hamming code, has a propagation delay less than a system which employs a parallel implementation of the bit serial CRC. In fact, the presented system has an XORing depth of degree three. (See FIG. 7.) A parallel implementaton of CRC—CCITT has an XORing depth of degree six. (See "Parallel CRC Lets Many Lines Use One Circuit", by A. K. Pandeya, Computer Design, September 1975, vol. 14, No. 9, p. 87–91.) Thus, the presented system is twice as fast as a parallel implementation of CRC—CCITT.

It is comtemplated that after having read the preceeding disclosure, certain alterations and modifications of the present invention will no doubt become apparent to those skilled in the art. It is therefore intended that the following claims be interpreted to cover all such alterations and modifications as fall within the true spirit and scope of the invention.

What is claimed is:

1. A method of encoding a block of data comprising in combination the steps of:

generating a plurality of check symbols from said data with an interleaved Reed-Solomon code with a generator polynomial $$g(x) = g_0(x^h),$$

where x is a variable, h is the degree of interleaving, and $g_0(x)$ is a generator polynomial of the form $$g_0(x) = \prod_{j=v}^{v+3} (x + \alpha^j) = x^4 + \alpha^a x^3 + \alpha^b x^2 + \alpha^a x + 1,$$

where $$v = 2^{m-1} - 2,$$

$\alpha$ is a primitive element of the Galois field $GF(2^m)$, a is a positive integer, b is a positive integer, and m is a positive integer; and appending said check symbols to said data.

2. A system for receiving signals representing data and for developing signals representing a codeword, the system comprising in combination:

correction verification generator means including a set of inputs for connection to receive the data signals and a set of outputs at which said correction verification generator means develops signals representing at least one first check symbol; and encoder/residue generator means including a set of inputs connected to receive said data signals followed by said first check symbol signals, and a set of outputs at which said encoder/residue generator means develops the codeword signals, said encoder/residue generator means including means for generating from said data and said first check symbols as "data" a plurality of second check symbols with an interleaved Reed-Solomon code with a generator polynomial $$g(x) = g_0(x^h),$$

where x is a variable, h is the degree of interleaving, and $g_0(x)$ is a generator polynomial of the form $$g_0(x) = \prod_{j=v}^{v+3} (x + \alpha^j) = x^4 + a^a x^3 + a^b x^2 + a^a x + 1,$$

where $$v = 2^{m-1} - 2.$$

$\alpha$ is a primitive element of the Galois field $GF(2^m)$, a is a positive integer, b is a positive integer, and m is a positive integer and for appending said first and said second check symbols to said data to develop said codeword.

3. A system as recited in claim 2 in which $m=8$ and $\alpha$ is a root of a primative polynomial $x^8 + x^6 + x^5 + x^4 + 1$ over GF(2).

4. A system as recited in claim 2 wherein said correction verification generator meas including means for generating said first check symbols with a code with a generator polynomial $$g_v(x) = x^p + 1$$

over the Galois field ($GF(2^m)$), where p is a positive integer.

5. A system as recited in claim 4 in which $p=2$ and $m=8$.

6. A system as recited in claim 4 wherein said correction verification generator means includes a plurality of input gates having a set of inputs and a set of outputs, said input gates for selectively coupling said data signals each to a corresponding one of said set of outputs of said input gates;

a plurality of feedback gates having a set of inputs and a set of outputs, said feedback gates for selectively coupling signals developed at said set of inputs of said feedback gates each to a corresponding one of said set of outputs of said feedback gates;

a plurality of output gates having a set of inputs and a set of outputs, said output gates for selectively coupling signals developed at said set of inputs of said output gates each to a corresponding one of said set of outputs of said output gates;

a half adder having a first set of inputs, a second set of inputs connected to said set of outputs of said input gates, and a set of outputs connected both to said set of inputs of said feedback gates and to said set of inputs of said output gates; and shift register means having a set of inputs connected to said set of outputs of said feedback gates and a set of outputs connected to said first set of inputs of said half adder.

7. A system as recited in claim 2 wherein said encoder/residue generator means includes a plurality of input gates having a set of inputs and a set of outputs, said input gates for selectively coupling said data and first check symbol signals each to a corresponding one of said set of outputs of said input gates;

a plurality of feedback gates having a set of inputs and a set of outputs, said feedback gates for selectively coupling signals developed at said set of inputs of said feedback gates each to a corresponding one of said set of outputs of said feedback gates;

a plurality of output gates having a set of inputs and a set of outputs, said output gates for selectively coupling signals developed at said set of inputs of said output gates each to a corresponding one of said set of outputs of said output gates;

a first half added having a first set of inputs connected to said set of outputs of said input gates, a second set of inputs, and a set of outputs connected both to said set of inputs of said output gates and to said set of inputs of said feedback gates;

a second half adder having a first set of inputs, a second set of inputs, and a set of outputs;

a third half adder having a first set of inputs, a second set of inputs, and a set of outputs;

a fourth half adder having a first set of inputs, a second set of inputs, and a set of outputs;

a first combinatorial circuit having a set of inputs connected to said set of outputs of said feedback gates and a set of outputs connected both to said first set of inputs of said fourth half adder and to said first set of inputs of said second half adder;

a second combinatorial circuit having a set of inputs connected to said set of outputs of said feedback gates and a set of outputs connected to said first set of inputs of said third half adder;

first shift register means having a set of inputs connected to said set of outputs of said second half adder and a set of outputs connected to said second set of inputs of said first half adder;

second shift register means having a set of inputs connected to said set of outputs of said third half adder and a set of outputs connected to said second set of inputs of said second half adder;

third shift register means having a set of inputs connected to said set of outputs of said fourth half adder and a set of outputs connected to said second set of inputs of said third half adder; and fourth shift register means having a set of inputs connected to said set of outputs of said first half adder and a set of outputs connected to said second set of inputs of said fourth half adder.

8. A system as recited in claim 7 wherein said encoder/residue generator means further receives signals representing a codeword, including data, first check symbols, and second check symbols, said first check symbols having been generated from said data with a code with a generator polynomial $$g_v(x) = x^p + 1$$

over the Galois field $GF(2^m)$, where p is a positive integer, said second check symbols having been generated from said data and said first check symbols as "data" with an interleaved Reed-Solomon code with a generator polynomial $$g(x) = g_0(x^h),$$

where x is a variable, h is the degree of interleaving, and $$g_0(x) = \prod_{j=v}^{v+3} (x + \alpha^j),$$

where $v = 2^{m-1} - 2,$ $\alpha$ is a primitive element of the Galois field (GF($2^m$)), and m is a positive integer and wherein said encoder/residue generator means further includes an error detector having a set of inputs connected to said set of inputs of said output gates and an output, said error detector for developing at said error detector output a signal which indicates the presence of an error in said codeword.

9. A system as recited in claim 7 wherein said fourth shift register means has h serially connected stages respectively designated $x^0, x^1, \ldots,$ and $x^{h-1}$, wherein said third shift register means has h serially connected stages respectively designated $x^h, x^{h+1}, \ldots,$ and $x^{2h-1}$, wherein said second shift register means has h serially connected stages respectively designated $x^{2h}, x^{2h+1}, \ldots,$ and $x^{3h-1}$, and wherein said first shift register means has h serially connected stages respectively designated $x^{3h}, x^{3h+1}, \ldots, x^{4h-1}$, and wherein h is greater than one.

10. A system as recited in claim 7 wherein said first combinatorial circuit employs means for performing multiplication by $\alpha^a$ in the Galois field GF($2^m$).

11. A system as recited in claim 7 wherein said second combinatorial circuit employs means for performing multiplication by $\alpha^b$ in the Galois field GF($2^m$).

12. A system for correcting errors in a codeword that includes data and check symbols at least a portion of which (2) have been generated at least said data with an interleaved Reed-Solomon code with a generator polynomial $$g(x) = g_0(x^h),$$

where x is a variable, h is the degree of interleaving, and $$g_0(x) = \prod_{j=v}^{v+3} (x + \alpha^j),$$

where $v = 2^{m-1} - 2,$ $\alpha$ is a primitive element of the Galois field GF($2^m$), and m is a positive integer, the system comprising in combination:

data buffer means for connection to receive the data portion of the codeword, said data buffer means for storing for a predetermined period said data;

encoder/residue generator means for connection to receive said codeword, said encoder/residue generator means including shift register means having a plurality of shift register stages respectively designated $x^0, x^1, \ldots,$ and $x^{4h-1}$ for generating a residue with said generator polynomial, correction iteration counter means connected to said encoder/residue generator means, said correction iteration counter means for counting h interations of a correction procedure including an ith iteration wherein $i = 1, 2, \ldots,$ and h and for developing a signal for terminating said correction procedure;

syndrome calculator means connected to said encoder/residue generator means to receive at said ith iteration the contents of said $x^{i-1}$th, said $x^{i-1+h}$th, said $x^{i-1+2h}$th, and $x^{i-1+3h}$th stages of said shift register means of said encoder/residue generator means, said syndrome calculator means for calculating four syndromes $$S_j = \bar{S}(\alpha^{v+j})/\alpha^{4(v+j)},$$

where
j = 1, 2, 3, and 4,
from the polynomial $$\bar{S}(x) = \bar{S}_3 x^3 + \bar{S}_2 x^2 + \bar{S}_1 x + \bar{S}_0,$$

where $\bar{S}_0, \bar{S}_1, \bar{S}_2,$ and $\bar{S}_3$ are equal to the contents of said $x^{i-1}$, said $x^{i-1+h}$, said $x^{i-1+2h}$, and said $x^{i-1+3h}$ stage, respectively, of said shift register means of said encoder/residue generator means at said ith iteration of said correction procedure;

error location polynomial calculator means connected to said syndrome calculator means to receive said syndromes, said error location polynomial calculator means for calculating an error location polynomial $$\sigma(x) = x^2 + \sigma_1 x + \sigma_2,$$

where $\sigma_1 = (S_1 S_2 + S_0 S_3)/\Delta,$ $\sigma_2 = (S_1 S_3 + S_2)/\Delta,$ and $\Delta = S_1^2 + S_0 S_2;$ error location calculator means connected to said error location polynomial calculator means to receive said error location polynomial, said error location calculator means for calculating at least one root $x_1$ of said error location polynomial to find an associated error location;

error value calculator means connected to said syndrome calculator means and to said error location calculator means, said error value calculator means for calculating an error value associated with said error location; and half adder means connected to said data buffer means and to said error value calculator means, said half adder means for correcting said error value at said error location in said data.

13. A system as recited in claim 12 wherein said error location calculator means calculates another root $x_2$ of said error location polynomial by means of an equation $x_2 = x_1 + \sigma_1.$ 14. A system as recited in claim 12 wherein encoder/residue generator means in responsive to a signal and operative to shift said residue in said shift register stages and wherein said system further comprises:

residue buffer means connected to said encoder/residue generator means and to said syndrome calculator means, said residue buffer means for receiving and storing said residue for a predetermined period of time; and error trapping correction unit means connected to said encoder/residue generator means and to said half adder means, said error trapping correction unit means for detecting a non-zero value in at least one of said $x^0$ through $x^{2h-1}$ stages, when the value in at least one of said $x^0$ through $x^{2h-1}$ stages is non-zero for developing said encoder/residue generator means shifting signal so as to cause said encoder/residue generator means to shift said residue, when the value in all of said $x^0$ through $x^{2h-1}$ stages is zero for receiving as a pattern of a single burst the contents of said $x^{4h-1}$ through $x^{2h}$ stages, for developing a count of the number of times said residue is shifted in said shift register stages, for developing from said count a burst location, and for developing a signal which indicates when said residue has been shifted a predetermined number of times.

15. A system for correcting errors in a codeword that includes data, a first group of check symbols and a second group of check symbols, at least a portion of the first group of check symbols having been generated by a code with a generator polynomial $$g_v(x) = x^p + 1,$$

over the Galois field $GF(2^m)$, where p is a positive integer, the second group of check symbols having been generated from the data and the first group of check symbols as "data" by an interleaved Reed-Solomon code with a generator polynomial $$g(x) = g_0(x^h),$$

where x is a variable, h is the degree of interleaving, and $$g_0(x) = \prod_{j=v}^{v+3} (x + \alpha^j),$$

where $$v = 2^{m-1} - 2,$$

$\alpha$ is a primitive element of the Galois field $GF(2^m)$, and m is a positive integer, the system comprising in combination:

correction verification generator means for connection to receive the data and the first group of check symbols of the codeword, said correction verification generator means for generating from said codeword with the generator polynomial $g_v(x)$ a first residue including at least one byte;

encoder/residue generator means for connection to receive said codeword, said encoder/residue generator means including shift register means having a plurality of shift register stages respectively designated $x^0, x^1, \ldots,$ and $x^{4h-1}$ for generating a second residue with the generator polynomial $g(x)$;

data buffer means for connection to receive said data of said codeword, said data buffer means for storing for a predetermined period said data;

correction iteration counter means connected to said encoder/residue generator means, said correction iteration counter means for counting h iterations of a correction procedure including an ith iteration wherein $i = 1, 2, \ldots,$ and h, and for developing a signal for terminating said correction procedure;

syndrome calculator means connected to said encoder/residue generator means to receive at each of said iterations the contents of said $x^{i-1}$th, said $x^{i-1+h}$th, said $x^{i-1+2h}$th, and $x^{i-1+3h}$th stages of said shift register means of said encoder/residue generator means, said syndrome calculator means for calculating four syndromes $$S_i = \bar{S}(\alpha^{v+j})/\alpha^{4(v+j)},$$

where
$j = 1, 2, 3,$ and 4,
from the polynomial $$\bar{S}(x) = \bar{S}_3 x^3 + \bar{S}_2 x^2 + \bar{S}_1 x + \bar{S}_0,$$

where $\bar{S}_0, \bar{S}_1, \bar{S}_2,$ and $\bar{S}_3$ are equal to the contents of said $x^{i-1}$, said $x^{i-1+h}$, said $x^{i-1+2h}$, and said $x^{i-1+3h}$ stage, respectively, of said shift register means of said encoder/residue generator means at said ith iteration of said correction procedure;

error location polynomial calculator means connected to said syndrome calculator means to receive said syndromes, said error location polynomial calculator means for calculating an error location polynomial $$\sigma(x) = x^2 + \sigma_1 x + \sigma_2,$$

where $$\sigma_1 = (S_1 S_2 + S_0 S_3)/\Delta,$$

$$\sigma_2 = (S_1 S_3 + S_2)/\Delta, \text{ and}$$

$$\Delta = S_1^2 + S_0 S_2;$$

error location calculator means connected to said error location polynomial calculator means to receive said error location polynomial, said error location modulator means for calculating at least one root $x_1$ of said error location polynomial to find an associated error location;

error value calculator means connected to said syndrome calculator means and to said error location calculator means, said error value calculator means for calculating an error value associated with said error location;

half adder means connected to said data buffer means and to said error value calculator means, said half adder means for correcting said error value at said error location in said data; and correction verification unit means connected to said error value calculator means to receive said error value when said error value was calculated from that portion of said codeword which includes said data and said first check symbols and connected to said correction verification generator means to receive said first residue byte, said correction verification unit means for storing a binary sequence, for XORing said stored binary sequence with said error value, for replacing said stored binary sequence with the results of said XORing, for comparing said stored XORing result with said first residue byte, and for developing a signal which indicates when said stored XORing result differs from said first residue byte.

16. A system for correcting errors in a codeword that includes data and check symbols at least a portion of which (2) have been generated from at least the data with an interleaved Reed-Solomon code with a generator polynomial $$g(x) = g_0(x^h),$$

where x is a variable, h is the degree of interleaving, and $$g_0(x) = \prod_{j=v}^{v+3} (x + \alpha^j),$$

where $$v = 2^{m-1} - 2,$$

α is a primitive element of the Galois field GF($2^m$), and m is a positive integer, the system comprising in combination:
data buffer means for connection to receive the data portion of the codeword, said data buffer means for storing for a predetermined period said data;
encoder/residue generator means for connection to receive said codeword, said encoder/residue generator means including shift register means having a plurality of shift register stages respectively designated $x^0$, $x^1$, ..., and $x^{4h-1}$ for generating a residue with said generator polynomial, said encoder/residue generator means being responsive to a signal and operative to shift said residue in said shift register stages;
residue buffer means connected to said encoder/residue generator means, said residue buffer means for receiving and storing said residue; firmware correction unit means including,
correction iteration counter means connected to said encoder/residue generator means, said correction iteration counter means for counting h iterations of a correction procedure including an ith iteration wherein i=1, 2, ..., and h and for developing a signal for terminating said correction procedure,
syndrome calculator means connected to said residue buffer means to receive at each of said iterations the contents of said $x^{i-1}$th, said $x^{i-1+h}$th, said $x^{i-1+2h}$th, and $x^{i-1+3h}$th stages of said shift register means of said encoder/residue generator means stored in said residue buffer means, said syndrome calculator means for calculating four syndromes $$S_j = \bar{S}(\alpha^{v+j})/\alpha^{4(v+j)},$$

where
j = 1, 2, 3, and 4,
from the polynomial $$\bar{S}(x) = \bar{S}_3 x^3 + \bar{S}_2 x^2 + \bar{S}_1 x + \bar{S}_0,$$

where $\bar{S}_0$, $\bar{S}_1$, $\bar{S}_2$, and $\bar{S}_3$ are equal to the contents of said $x^{i-1}$, said $x^{i-1+h}$, said $x^{i-1+2h}$, and said $x^{i-1+3h}$ stage, respectively, of said shift register means of said encoder/residue generator means at said ith iteration of said correction procedure;
error location polynomial calculator means connected to said syndrome calculator means to receive said syndromes, said error location polynomial calculator means for calculating an error location polynomial $$\sigma(x) = x^2 + \sigma_1 x + \sigma_2,$$

where $$\sigma_1 = (S_1 S_2 + S_0 S_3)/\Delta,$$

$$\sigma_2 = (S_1 S_3 + S_2^2)/\Delta, \text{ and}$$

$$\Delta = S_1^2 + S_0 S_2,$$

error location calculator means connected to said error location polynomial calculator means to receive said error location polynomial, said error location calculator means for calculating at least one root $x_1$ of said error location polynomial to find an associated error location,
error value calculator means connected to said syndrome calculator means and to said error location calculator means, said error value calculator means for calculating an error value associated with said error location, and
error trapping correction unit means connected to said encoder/residue generator means, said error trapping correction unit means for detecting a non-zero value in at least one of said $x^0$ through $x^{2h-1}$ stages, when the value in at least one of said $x^0$ through $x^{2h-1}$ stages is non-zero for developing said encoder/residue generator means shifting signal so as to cause said encoder/residue generator means to shift said residue, when the value in all of said $x^0$ through $x^{2h-1}$ stages is zero for receiving as a patter of a single burst the contents of said $x^{4h-1}$ through $x^{2h}$ stages, for developing a ccount of the number of times said residue is shifted in said shift register stages, for developing from said count a burst location, and for developing a signal which indicates when said residue has been shifted a predetermined number of times; and
half adder means connected to said data buffer means, to said error trapping correction unit means, and to said error value calculator means, said half adder means for correcting said error value at said error location in said data.

17. A method of encoding a block of data comprising in combination the steps of:
generating a plurality of check symbols from said data with a Hamming code with a generator polynomial $$g_d(x) = x^2 + ax + 1,$$

which is irreducible over the Galois field GF($2^m$) and which has a period equal to $$(2^{2m} - 1)/(2^m - 1),$$

with symbols from the Galois field GF($2^m$), where x is a variable and m is a positive integer; and
appending said check symbols to said data.
18. A method as recited in claim 17 wherein
m = 8
and
a = $\alpha^9$,
where α is a root of a primitive polynomial $$x^8 + x^6 + x^5 + x^4 + 1$$

over GF(2).
19. A system for detecting errors in a codeword that includes data and check symbols which have been generated from the data with a generator polynomial $g_d(x) = x^2 + ax + 1,$ which is irreducible over the Galois field GF($2^m$) and which has a period equal to $(2^{2m}-1)/(2^m-1),$ where x is a variable and m is a positive integer, the system comprising in combination:

an encoder/residue generator including, a plurality of input gates having a set of inputs and a set of outputs, said input gates for selectively coupling externally developed signals each to a corresponding one of said set of outputs of said input gates, a plurality of feedback gates having a set of inputs and a set of outputs, said feedback gates for selectively coupling signals developed at said set of inputs of said feedback gates each to a corresponding one of said set of outputs of said feedback gates, a plurality of output gates having a set of inputs and a set of outputs, said output gates for selectively coupling signals developed at said set of inputs of said output gates each to a corresponding one of said set of outputs of said output gates, 'a first half adder having a first set of inputs connected to said set of outputs of said input gates, a second set of inputs, and a set of outputs connected both to said set of inputs of said feedback gates and to said set of inputs of said output gates, a second half adder having a first set of inputs, a second set of inputs, and a set of outputs, a combinatorial circuit having a set of inputs connected to said set of outputs of said feedback gates and a set of outputs connected to said first set of inputs of said second half adder, first shift register means having a set of inputs connected to said set of outputs of said second half adder and a set of outputs connected to said second set of inputs of said first half adder, and second shift register means having a set of inputs connected to said set of outputs of said first half adder and a set of outputs connected to said second set of inputs of said second half adder and an error detector connected to said set of inputs of said output gates.

20. A system as recited in claim 19 wherein said combinatorial circuit employs means for performing multiplication by a in the Galois field GF($2^m$).

* * * * *

UNITED STATES PATENT OFFICE
CERTIFICATE OF CORRECTION

Patent No. 4,782,490          Dated Nov. 1, 1988

Inventor(s) Grigory Tenengolts

It is certified that error appears in the above-identified patent and that said Letters Patent are hereby corrected as shown below:

Col. 2, line 8, change "Berklekamp" to --Berlekamp--;
Col. 3, line 4, change "of" to --by--;

Col. 11, line 53, change "$X^{i=1+3h}$" to --$X^{i-1+3h}$--;

Col. 12, line 20, change "$\sigma_2=(S_1S_3+S_2)/\Delta$" to --$\sigma_2=(S_1S_3+S_2^2)/\Delta$--;

Col. 17, line 32, change "$l_1=wd(\alpha^p)1$" to --$l_1 wd(\alpha^p)+1$--;

Col. 19, line 23, change "verification generator meas" to --verification generator means--;

Col. 21, line 68, change "$X^{i-1+2H}$" to --$X^{i-1+2h}$--;

Col. 22, line 30, change "$\sigma_2=(S_1S_3+S_2)/\Delta$" to --$\sigma_2=(S_1S_3+S_2^2)/\Delta$--;

Col. 22, line 56, change "in" to --is--;

Col. 23, line 67, change "$X^{i-1}th$" to --$X^{i-1+h}th$--;

Col. 24, line 29, change "$\sigma_2=(S_1S_3+S_2)/\Delta$" to --$\sigma_2=(S_1S_3+S_2^2)/\Delta$--;

Col. 26, line 3, change "$\sigma_2=(S_1S_3+S_2)/\Delta$" to --$\sigma_2=(S_1S_3+S_2^2)/\Delta$--;

Col. 26, line 29, change "patter" to --pattern--;

UNITED STATES PATENT AND TRADEMARK OFFICE
CERTIFICATE OF CORRECTION

PATENT NO. : 4,782,490

DATED : November 1, 1988

INVENTOR(S) : Grigory Tenengolts

It is certified that error appears in the above-identified patent and that said Letters Patent is hereby corrected as shown below:

Col. 26, line 30, change "ccount" to -- count --.

Signed and Sealed this

Fourteenth Day of February, 1989

*Attest:*

DONALD J. QUIGG

*Attesting Officer*   *Commissioner of Patents and Trademarks*